(12) United States Patent
Schuur et al.

(10) Patent No.: US 7,646,325 B2
(45) Date of Patent: Jan. 12, 2010

(54) ANALOG TO DIGITAL CONVERTER

(75) Inventors: Axel Schuur, Mountain View, CA (US); David H. Shen, San Jose, CA (US); Ann P. Shen, Saratoga, CA (US)

(73) Assignee: NanoAmp Mobile, Inc., Santa Clara, CA (US)

( * ) Notice: Subject to any disclaimer, the term of this patent is extended or adjusted under 35 U.S.C. 154(b) by 2 days.

(21) Appl. No.: 12/187,632

(22) Filed: Aug. 7, 2008

(65) Prior Publication Data

US 2009/0085789 A1  Apr. 2, 2009

Related U.S. Application Data

(60) Provisional application No. 60/975,755, filed on Sep. 27, 2007.

(51) Int. Cl.
*H03M 1/12* (2006.01)
(52) U.S. Cl. .................. 341/172; 341/122; 341/143; 341/150; 341/155
(58) Field of Classification Search ......... 341/118–122, 341/143, 150, 155, 172
See application file for complete search history.

(56) References Cited

U.S. PATENT DOCUMENTS

| | | | | | |
|---|---|---|---|---|---|
| 4,439,756 | A | * | 3/1984 | Shenoi et al. | 341/143 |
| 5,012,247 | A | * | 4/1991 | Dillman | 341/172 |
| 5,150,324 | A | * | 9/1992 | Takasuka et al. | 708/801 |
| 5,159,341 | A | * | 10/1992 | McCartney et al. | 341/143 |
| 5,557,187 | A | | 9/1996 | Koch et al. | |
| 6,147,631 | A | | 11/2000 | Maulik et al. | |
| 6,768,436 | B1 | * | 7/2004 | Chuang | 341/143 |
| 6,927,718 | B2 | * | 8/2005 | Koch | 341/143 |
| 6,952,176 | B2 | | 10/2005 | Frith et al. | |
| 7,167,119 | B1 | * | 1/2007 | Lei et al. | 341/143 |
| 7,235,983 | B2 | * | 6/2007 | O'Dowd et al. | 324/658 |
| 7,304,483 | B2 | * | 12/2007 | O'Dowd et al. | 324/658 |
| 7,408,494 | B2 | * | 8/2008 | Mitteregger | 341/143 |
| 7,411,534 | B1 | * | 8/2008 | Melanson | 341/131 |
| 2007/0171114 | A1 | * | 7/2007 | Wu | 341/155 |
| 2009/0027247 | A1 | * | 1/2009 | Kumamoto et al. | 341/143 |

FOREIGN PATENT DOCUMENTS

KR  1020040011555  2/2004

OTHER PUBLICATIONS

PCT International Search Report and Written Opinion issued in International Application No. PCT/US2008/077013 mailed Feb. 25, 2009, 11 pages.

* cited by examiner

*Primary Examiner*—Linh V Nguyen
(74) *Attorney, Agent, or Firm*—Fish & Richardson P.C.

(57) ABSTRACT

An ADC, such as a CT SD-ADC, includes a clock generation circuit that produces charging and discharging clock signals such that a settling time for an integrator in the ADC is increased. The clock signals may control a feedback SD-DAC in the CT SD-ADC. The clock signals also may be asymmetric and/or may result in the settling time of the integrator being greater than half the system clock.

32 Claims, 6 Drawing Sheets

ANALOG TO DIGITAL CONVERTER

CROSS-REFERENCE TO RELATED APPLICATIONS

This application claims the benefit of priority from U.S. Provisional Application entitled "Continuous-Time Sigma-Delta ADC," Application No. 60/975,755 filed Sep. 27, 2007, the disclosure of which is incorporated by reference.

TECHNICAL FIELD

This disclosure relates to sigma-delta analog-to-digital converters.

BACKGROUND

A continuous time sigma-delta analog-to-digital converter (CT SD-ADC) can be used in various circuits to convert an analog signal into a digital signal.

SUMMARY

Generally, implementations may involve using asymmetric timing in the feedback path of an analog-to-digital converter (ADC). One or more of the designs set forth in the present disclosure may be able to provide, for example, relaxed timing requirements on integrators in a sigma-delta analog-to-digital converter, thereby providing power savings. In addition, the designs described here can be compatible with digital algorithms used in communication systems.

In one aspect, an analog input is coupled to an input terminal of a cascade of at least one integrator and an output of the cascade of at least one integrator is coupled to an input of a quantizer. The quantizer configured to provide a digital output signal on a quantizer output. An input of a switched capacitor digital to analog converter is coupled to the quantizer output and an output of the switched capacitor digital to analog converter is coupled to the input terminal of the cascade of at least one integrator. A charge clock output of a clock generator and a discharge clock output of the clock generator are coupled to the switched capacitor digital to analog converter. The clock generator is configured to produce a charge clock signal on the charge clock output and a discharge clock signal on the discharge clock output to charge and discharge the switched capacitor analog to digital converter. The charge clock signal and the discharge clock signal have the same clock cycle but different asymmetric duty cycles such that the charge clock signal has a charging signal that is shorter than 50% of the clock cycle and the discharge clock signal has a discharging signal longer than 50% of the clock cycle.

Implementations of this aspect may include one or more of the following features. For example, the charge clock signal may be coupled to the quantizer such that the quantizer samples the output of the cascade of at least one integrator during the charging signal of the charge clock signal. The quantizer may have one or more quantization levels. The quantizer output may be coupled to a digital filter.

The switched capacitor digital to analog converter may include a capacitor, one or more switches, and a reference voltage.

The clock generator may be configured to generate the charge clock signal and the discharge clock signal such that the charging signal of the charge clock signal does not overlap the discharging signal of the discharge clock signal. The clock generator may be configured to generate the charge clock signal and the discharge clock signal based on a system clock and the available settling time for the at least one integrator may be greater than half a clock cycle of the system clock. The clock cycle of the charge clock signal and the discharge clock signal may be a sampling rate of the analog to digital converter. The analog to digital converter may be a continuous time sigma-delta analog to digital converter.

In another aspect, an analog input signal is applied to an input terminal of a cascade of at least one integrator to generate an integrated output signal and the integrated output signal is applied to an input of a quantizer to generate a digital output signal. The digital output signal is applied to an input of a switched capacitor digital to analog converter to generate an output signal and the output signal of the switched capacitor digital to analog converter is applied to the input terminal of the cascade of at least one integrator. A charge clock signal and a discharge clock signal are applied to the switched capacitor digital to analog converter to charge and discharge the switched capacitor digital to analog converter. The charge clock signal and discharge clock signal have the same clock cycle but different asymmetric duty cycles such that the charge clock signal has a charging signal shorter than 50% of the clock cycle and the discharge clock signal has a discharging signal longer than 50% of the clock cycle.

Implementations of this aspect may include one or more of the following features. For example, the charge clock signal may be applied to the quantizer such that the quantizer samples the output of the cascade of at least one integrator during the charging signal of the charge clock signal. The quantizer may have one or more quantization levels. The digital output signal may be applied to an input of a digital filter.

The switched capacitor digital to analog converter may include a capacitor, one or more switches, and a reference voltage.

The charge clock signal and the discharge clock signal may be generated such that the charging signal of the charge clock signal does not overlap the discharging signal of the discharge clock signal. The clock cycle of the charge clock signal and the discharge clock signal may be a sampling rate of the analog to digital converter. The charge clock signal and the discharge clock signal may be generated based on a system clock and the available settling time for the at least one integrator may be greater than half a clock cycle of the system clock. The analog to digital converter may be a continuous time sigma-delta analog to digital converter.

In another aspect, an analog to digital converter includes a cascade of at least one integrator and a quantizer having an input coupled to an output of the cascade of at least one integrator and an output to provide a digital output signal. A switched capacitor digital to analog converter has an input coupled to the output of the quantizer. The input of the at least one integrator of the analog to digital converter is a summing junction which is coupled to an analog input signal, and an output signal of the switched capacitor digital to analog converter. A clock generator is configured to generate a charge clock signal and a discharge clock signal coupled to the switched capacitor digital to analog converter to charge and discharge the switched capacitor digital to analog converter. The charge clock signal and discharge clock signal have the same clock cycle but different asymmetric duty cycles such that the charge clock signal has a charging signal shorter than 50% of the clock cycle and the discharge clock signal has a discharging signal longer than 50% of the clock cycle.

Implementations of this aspect may include one or more of the following features. For example, the charge clock signal may be coupled to the quantizer such that the quantizer samples the output of the cascade of at least one integrator during the charging signal of the charge clock signal. The quantizer may have one or more quantization levels. The digital output signal may be coupled to a digital filter.

The switched capacitor digital to analog converter may include a switched capacitor, one or more switches, and a reference voltage.

The clock generator may be configured to generate the charge clock signal and the discharge clock signal such that the charging signal of the charge clock signal does not overlap the discharging signal of the discharge clock signal. The clock cycle of the charge and the discharge clock signals may be a sampling rate of the analog to digital converter. The clock generator may be configured to generate the charge clock signal and the discharge clock signal based on a system clock and the available settling time for the at least one integrator is greater than half a clock cycle of the system clock. The analog to digital converter may be a continuous time sigma-delta analog to digital converter.

In another aspect, a receiver includes, an antenna to receiver a radio frequency input signal and a radio frequency filter coupled to the antenna to receive the radio frequency input signal from the antenna. A low noise amplifier has an input coupled to an output of the radio frequency filter. A first mixer is coupled to an output of the low noise amplifier and configured to perform image rejection and mix an output signal of the low noise amplifier with a first local oscillator signal. An intermediate frequency filter is coupled to an output of the first mixer. A second mixer is coupled to an output of the intermediate frequency filter and configured to mix an output signal of the intermediate frequency filter with a second local oscillator signal. A low-pass filter has an input coupled to an output of the second mixer. A digital to analog converter has an input coupled to an output of the low-pass filter. The digital to analog converter includes a cascade of at least one integrator, a quantizer, a switched capacitor digital to analog converter, a summing junction, and a clock generator. The quantizer has an input coupled to an output of the cascade of at least one integrator and an output to provide a digital output signal. The switched capacitor digital to analog converter has an input coupled to the output of the quantizer. The input of the at least one integrator of the analog to digital converter is a summing junction which is coupled to an input signal to the analog to digital converter, and an output signal of the switched capacitor digital to analog converter. The clock generator is configured to generate a charge clock signal and a discharge clock signal coupled to the switched capacitor digital to analog converter. The charge clock signal and the discharge clock signal have the same clock cycle but different asymmetric duty cycles such that the charge clock signal has a charging signal shorter than 50% of the clock cycle and the discharge clock signal has a discharging signal longer than 50% of the clock cycle. The receiver further includes a baseband processing device having an input coupled to the output of the quantizer to digitally filter the digital output signal.

Implementations of this aspect may include one or more of the features described above or below. For example, the charge clock signal may be coupled to the quantizer such that the quantizer samples the output of the cascade of at least one integrator during the charging signal of the charge clock signal.

The details of one or more implementations are set forth in the accompanying drawings and the description below. Other features will be apparent from the description and drawings, and from the claims.

DETAILED DESCRIPTION

Sigma-Delta Analog-to-Digital converters (SD-ADC) can be used in radio frequency (RF) circuitry to reduce a level of power consumed. SD-ADCs can be designed with a discrete-time switched-capacitor (SC) topology, or with a continuous-time (CT) topology. CT converters can provide for anti-alias filtering in converters. Also, CT converters may not require the output signals of all integrator stages to settle as fast as in a converter. As such, CT converters can have less stringent requirements on the circuits used for the integrator stages and can have a lower power consumption than SC converters.

However, a CT SD-ADC can be more susceptible to clock jitter when compared to an SC SD-ADC. To relax the clock jitter requirements, a hybrid of both SC and CT topologies can be used in a converter. Such a hybrid can incorporate a CT SD-ADC that uses a SC digital-to-analog converter (DAC) in a feedback loop.

In such a hybrid converter, the first integrator may be required to settle within about 50% of a clock cycle for the output value to be stable before being sampled by the quantizer at the loop filter output. The sampling by the quantizer may have to occur at the next half clock cycle.

Figure 1:
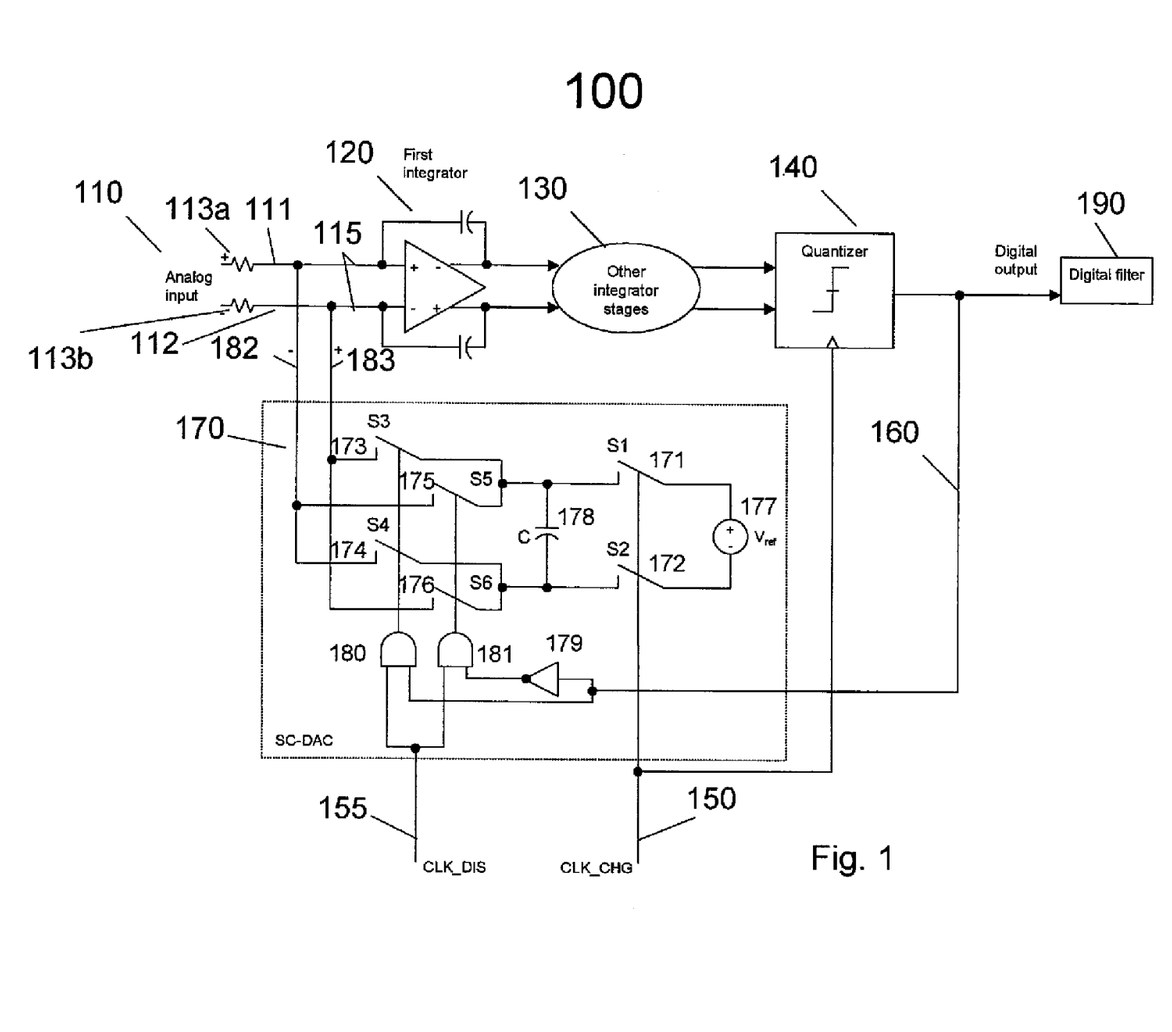
FIG. 1 is a diagram illustrating an example of a continuous time sigma-delta analog-to-digital converter with a switched capacitor digital-to-analog converter feedback loop.

FIG. 1 is a diagram illustrating an example of a CT SD-ADC 100 with a switched capacitor DAC feedback loop. In the ADC 100, a differential analog input signal 110 is sent into a first integrator 120 and the output of the first integrator 120 is provided to subsequent integrator stages 130. The output of the integrators 120, 130 is quantized in a quantizer 140, which produces the digital output 160. The digital output signal 160 can then be filtered by a digital filter 190.

The digital filter 190 can also provide for decimation of the output signal 160. This decimation can reduce the data rate of the output signal 160 and simultaneously increase the bit width (number of bits) of the output signal 160. For example, the data rate at the digital output 160 can be 100 MHz, providing a high oversampling rate over a signal which can for example have a bandwidth of only 1 MHz. In this example, the oversampling rate would be 50 since the Nyquist sampling rate is equal to two times the signal bandwidth of 1 MHz. Decimation can reduce the sampling rate of the signal from the digital output 160 sampling rate to as little as the Nyquist rate. This filtering process can be described as a moving averaging function. For example, to decimate the sampling rate by a factor of 10, provided a bit width of 1 for digital output 160 (1-bit output), the digital filter 190 would provide for decimation by calculating one output value for every ten input values. This operation can reduce the sample rate by a factor of ten and also increase the bit width from 1 to a higher number. The output bit width can be dependent on the dynamic range requirements of the application.

The digital output 160 is also fed back into the first integrator 120 via an SC-DAC 170. Clock signals CLK_CHG 155 and CLK_DIS 150 are sent into the SC-DAC 170, while clock signal CLK_CHG 155 is also sent into the quantizer 140.

In the implementation shown, the SC-DAC 170 includes a reference voltage 177 with a constant value of $V_{ref}$, a capacitor 178, switches 171-176 controlled by the clock signals CLK_CHG 155 and CLK_DIS 150 together with the fed back digital output 160 to generate reference signals 182 and 183. The switches 171 and 172 are switched to a closed state by CLK_CHG 155 while the switches 173-176 are switched in an open position by CLK_DIS 150 during a charging cycle to charge capacitor 178. For the implementation shown, the charging cycle occurs when CLK_CHG 155 is high, while CLK_DIS 150 is low.

During a discharge cycle, switches 171 and 172 are switched to an open state and either switches 173-174 or 175-176 are switched to a closed state to discharge the capacitor 178, and therefore providing the reference voltage value $V_{ref}$ (assuming the capacitor 178 is fully charged), to the first integrator 120. For the implementation shown, the discharging cycle occurs when CLK_CHG 155 is low, while CLK_DIS 150 is high. The polarity of the voltage provided by the capacitor 178 on input terminals 111 and 112 is determined by the fed back digital output 160. Due to the fact that the positive differential output line 183 of the feedback SC-DAC 170 is connected to the negative side of the differential input signal 110 via a resistor 113a, and also the negative differential output line 182 of the feedback SC-DAC 170 is connected to the positive side of the differential input signal 110 via another resistor 113b, the output of the feedback SC-DAC 170 is subtracted from the input signal 110 and this difference 115 is integrated by the first integrator 120. Due to this arrangement, the circuit 100 will work to adjust the signal difference 115 to be minimal and therefore the digital output signal 160 may, averaged over time, closely follow the input signal 110. Circuit 100 operates to perform analog to digital conversion, with the digital signal being output by the quantizer 140.

For proper operation, the output signal of the first integrator 120 and other integrator stages 130 may have to be settled completely before their outputs are sampled by the quantizer 140. Therefore the required settling times ("speed") of the integrators may be related to the choice of timing relationship of the clock signals 150 and 155 (because clock signals 150 and 155 control the charge and the discharge timings of capacitor 178 and sampling by quantizer 140).

Figure 2:
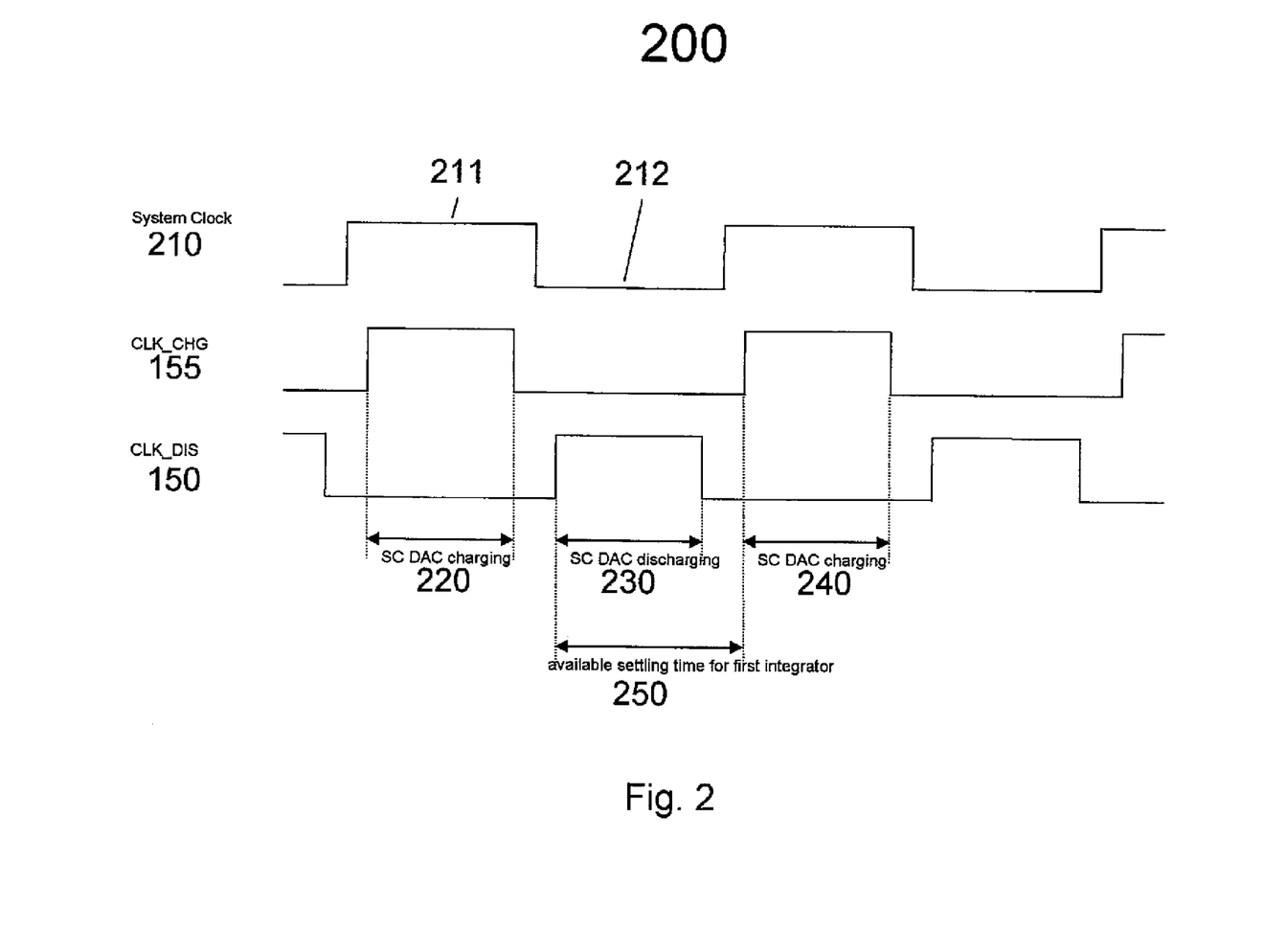
FIG. 2 is a timing diagram illustrating one example of clock signals used in a switched capacitor digital-to-analog converter feedback loop.

FIG. 2 is a timing diagram 200 of an example of clock signals that can be used in the SC-DAC feedback loop of CT SD-ADC 100. Specifically, the timing diagram 200 illustrates an example of the timing of the CLK_DIS 150 and CLK_CHG 155 clock signals, as well as the system clock 210, that can be used in the CT SD-ADC 100 of FIG. 1. Here, the input system clock 210 is assumed to be symmetric ("50% duty cycle") so that the duration of the positive half-cycle 211 is equal to that of the negative half-cycle 212. The signals CLK_CHG 155 and CLK_DIS 150 can be derived from the system clock 210 such that they have the same frequency and duty cycle (which, in the implementation shown, is approximately 50% for both clocks). Further, the signals CLK_CHG 155 and CLK_DIS 150 can be derived such that the positive half-cycle of CLK_CHG 155 occurs during the positive half-cycle of the system clock 210, and the positive half-cycle of CLK_DIS 150 occurs during the negative half-cycle of the system clock 210. The signals 155 and 150 may also be configured such that they are non-overlapping, such that their positive half-cycles do not overlap.

The clock signals CLK_CHG 155 and CLK_DIS 150 in timing diagram 200 may be used to control the SC-DAC 170 and the quantizer 140 in the CT SD-ADC 100. In such an implementation, the positive half-cycle 220 of CLK_CHG 155 may be used to charge the capacitor 178 as shown by charging intervals 220 and 240. The capacitor 178 may discharge into the first integrator 120 during the positive half-cycle 230 of CLK_DIS 150 as shown by interval 230. The signal CLK_CHG 155 may also be used as the clock for the quantizer 140. In such an implementation, the output signals of the integrators 120, 130 may be sampled with the rising edge of the clock signal CLK_CHG 155. In this case the available time for the output signals of the integrators 120, 130 to settle may be constrained by the time difference between the rising edge of CLK_DIS 150 and the rising edge of CLK_CHG 155 as shown by the interval 250. In the case of a symmetric system clock 210, this available settling time 250 may be equal to one half of the cycle time of the system clock 210. If the settling time of the first integrator is greater than the available settling time, the CT SD-ADC 100 becomes sensitive to clock jitter exhibited at the falling edge of CLK_DIS 150. In this case, the CT SD-ADC 100 is sensitive to the pulse width of the high phase of CLK_DIS 155 which greatly increases the jitter contribution.

Figure 3:
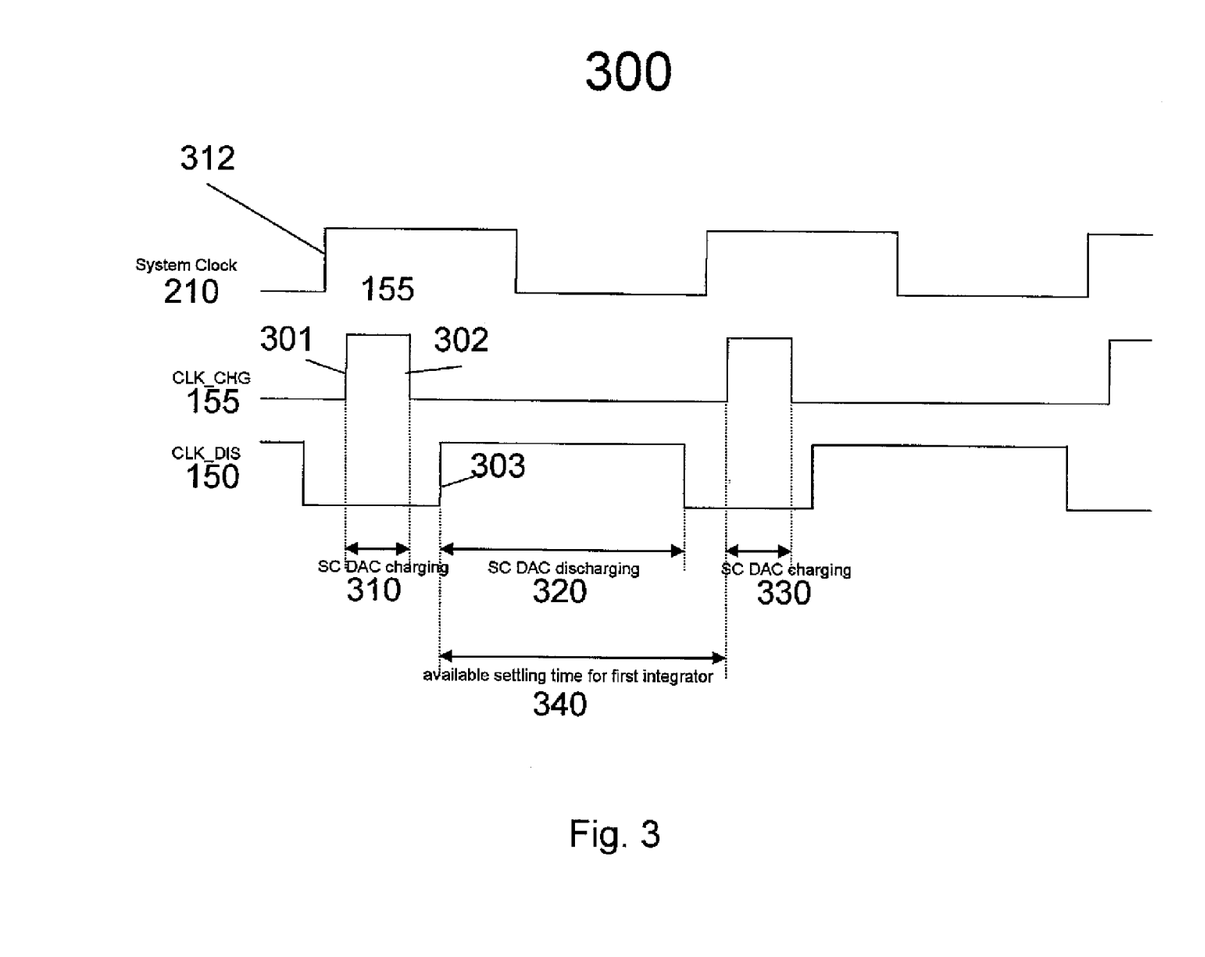
FIG. 3 is a timing diagram illustrating another example of clock signals used in a switched capacitor digital to analog converter feedback loop.

FIG. 3 is a timing diagram 300 of another example of clock signals that can be used in the SC-DAC feedback loop 170 of CT SD-ADC 100. Specifically, the timing diagram 300 illustrates an example embodiment of the timing of the CLK_DIS 150 and CLK_CHG 155 clock signals, as well as a system clock 210, that can be used in the CT SD-ADC 100 of FIG. 1 for the SC-DAC 170 and quantizer 140. As in the previously described timing diagram 200, the positive half-cycles of the clock signals CLK_CHG 155 and CLK_DIS 150 may be derived from the system clock 210. Different to the situation in timing diagram 200, in timing diagram 300, the positive half-cycle of CLK_CHG 155 has been made much shorter than the half-cycle of the system clock 210. Specifically, CLK_CHG 155 and CLK_DIS 150 have the same clock cycle but different asymmetric duty cycles. The asymmetric duty cycles are generated such that the charging signal of CLK_CHG 155 is shorter than 50% of the clock cycle and the discharging signal of CLK_DIS 150 is longer than 50% of the clock cycle.

The rising edge 301 of CLK_CHG 155 may be derived from the rising edge 312 of the system clock 210, with the falling edge 302 of CLK_CHG 155 generated by a timing circuit that resets the value of the CLK_CHG 155 after a specified period of time. The rising edge 303 of CLK_DIS 150 may be generated by a second timing circuit with a specified amount of time related to the falling edge 302 of CLK_CHG 155 and CLK_DIS 155 may have at least part of its positive cycle overlap with the positive cycle of the system clock 210.

Generally, the duty cycle used for CLK_CHG 155 can be determined by the charge time of the SC-DAC 170 for a specified charging percentage and the duty cycle used for CLK_DIS 150 can be determined by the settling time of the first integrator together with the SC-DAC 170 required discharging time. During the charging cycle, the varying voltage on the capacitor 178 can be represented by the equation $v(t) = V_{ref}[1 - e^{-t/(R1*C)}]$ where $V_{ref}$ is the value of the reference voltage 177, C is the capacitance of the capacitor 178 in the SC-DAC 170 and R1 is the total resistance of the switch resistances in the charging circuit and R1*C is the time constant for the capacitor 178. The discharge equation of the capacitor voltage can be represented by $v(t)=V_{ref}e^{-t/(R2*C)}$ where R2 is the total resistance in the discharging circuit and R2*C is the time constant.

In an arrangement as described by the timing diagram 300, the time for charging the capacitors 310 in the SC-DAC 170 in the CT SD-ADC 100 may be much shorter than one half cycle of the system clock 210, as this may occur during the positive half-cycle of CLK_CHG 155. The charging time is shown by intervals 310 and 330. Similar to the situation described with respect to the timing diagram 200, the available time for the outputs of the integrators 120, 130 to settle may be related to the time difference between the rising edges of CLK_CHG 155 and CLK_DIS 150. In an arrangement as shown in timing diagram 300, this available settling time 340 may be significantly longer than one half cycle of the system clock 210.

In general, if a clock timing as described in timing diagram 300 is employed, it may be possible to design the CT SDADC 100 using slower integrators 120, 130 than in a case in which a clock timing as described in the timing diagram 200 is used. Alternatively, while using the same integrators, the sampling rate of the SD-ADC and hence its dynamic range may be increased when using the clock timing in timing diagram 300 as opposed to the clock timing in diagram 200.

In other words, as shown, the SC discharging can occur at the same time as the settling operation of the first integrator. Since the limiting factor of an SD-ADC can be the settling time of the first integrator, by allowing a longer time for discharging (and, hence, settling operation of the first integrator) as in the timing diagram 300, the sampling rate of the SD ADC can be increased, i.e. higher bit resolution can be achieved. Alternatively, if the sampling rate is not changed (it may be constrained by the application of the SD-ADC) chip power and area reductions can be achieved.

Specifically, the dynamic range (DR) of an SD-ADC can be approximated by $DR=10 \log 10\{(3/2)[(2L+1)/\pi^{2L}](2N-1)^2 M^{2L+1}\}$ dB for a full-scale sinusoidal input. A full scale input is the maximum amplitude of input signal that can be correctly processed by the SD-ADC. Input signal levels greater than the full-scale level can cause the SD-ADC to become unstable and exhibit oscillation. L is the order of the SD modulator or the number of integrator stages, N is the quantization level number and M is the oversampling ratio which is the quantizer sampling rate to the Nyquist sampling rate. The equivalent bit resolution of the SD ADC can be represented as $R=(DR-1.76)/6.02$ dB. The SD-ADC equivalent resolution can be increased by increasing one or more of the three parameters L, N and M depending on the design requirements and implementation limitations. The Nyquist rate of the signal to be processed is twice the bandwidth of the signal.

Modern applications, such as communication systems, can require the bandwidth of the signal to be increased. For example, to provide for video streaming can require a signal with higher bandwidth than necessary to provide only for speech processing. Based on above formula, if all other parameters are kept unchanged, an increase of signal bandwidth can result in a reduction of the oversampling rate, therefore a reduction of the DR.

Increasing the DR by simply increasing the SD modulator order L can require more circuitry that can increase the power consumption or chip area. Increasing the DR by simply increasing the oversampling ratio M can require a higher system clock frequency which can also increase power consumption or chip area in the clock generation and distribution circuits, and also may require the integrators and feedback DAC to settle faster, also increasing power consumption or chip area for these circuits. Increasing the DR by simply increasing the number of quantization levels N can require the quantizer and DAC to be more linear, which can also increase power consumption or chip area.

However, if the clock timing illustrated in diagram 300 is used, an SD-DAC with integrators and feedback DACs having given settling times and discharging times may be able to operate at a higher sampling rate, thereby enabling a higher oversampling ratio without increased power consumption or chip area for these circuits. This may allow for the bandwidth of the signal to be processed to be increased for an SD-ADC with integrators and feedback DACs having the given settling times and discharging times.

Alternatively, when clock timing such as that shown in diagram 300 is used, the settling time of integrators and discharging time of feedback DACs may be able to be increased for a given unchanged sampling rate and oversampling ratio, which can result in reduced power consumption or chip area.

Figure 4:
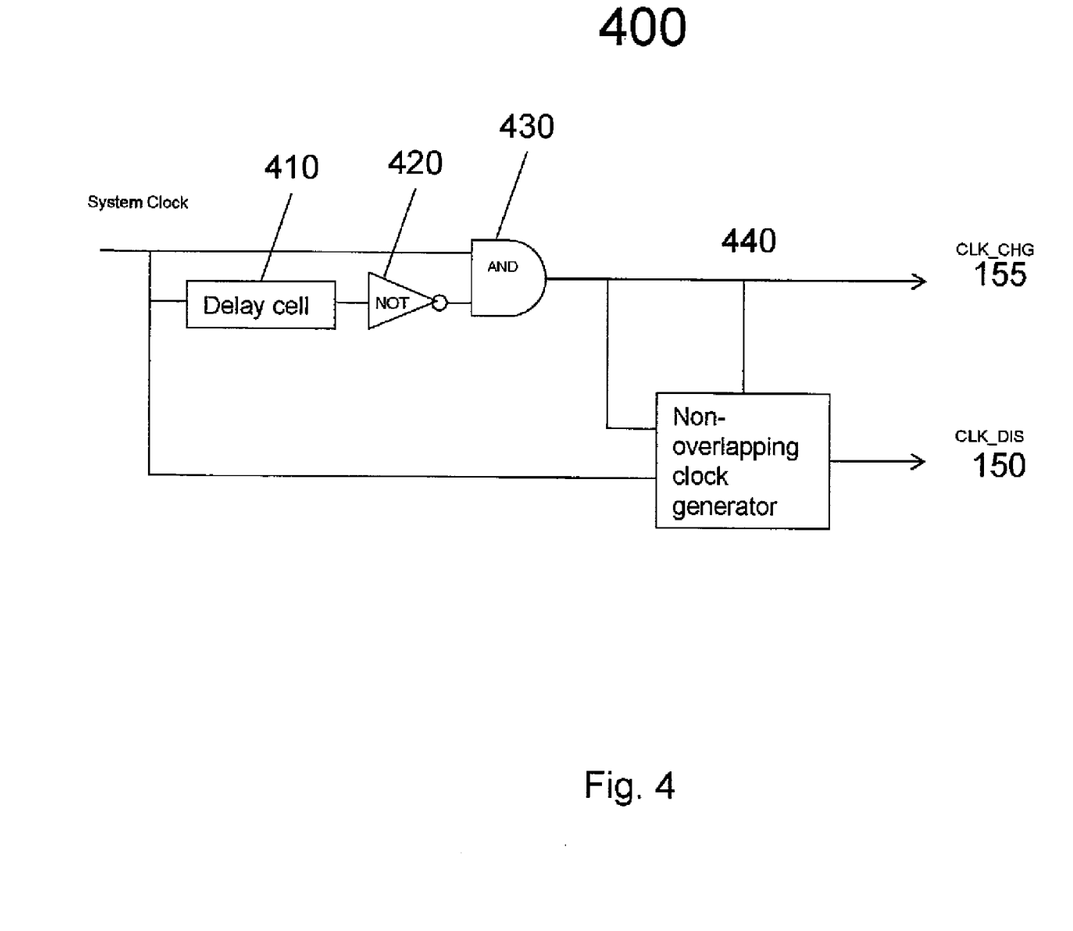
FIG. 4 is a diagram showing an example of a clock generator circuit.

FIG. 4 is a diagram illustrating an example of a clock generator circuit 400 which may be used to generate the clock signals CLK_CHG 155 and CLK_DIS 150 as described in the timing diagram 300. An AND gate 430 generates a high logic level output when the system clock 210 has a high logic level. A delayed version of the system clock 210, generated by the delay cell 410, may be delayed in making transition from logic low level to logic high level. The output of the AND gate 410 will therefore have a pulse shape with a pulse width as set by the delay of the delay cell 410. Furthermore, a nonoverlapping clock generator 440 can be used to generate the CLK_DIS signal 150 from the system clock 210 and the CLK_CHG signal 155.

Figure 5:
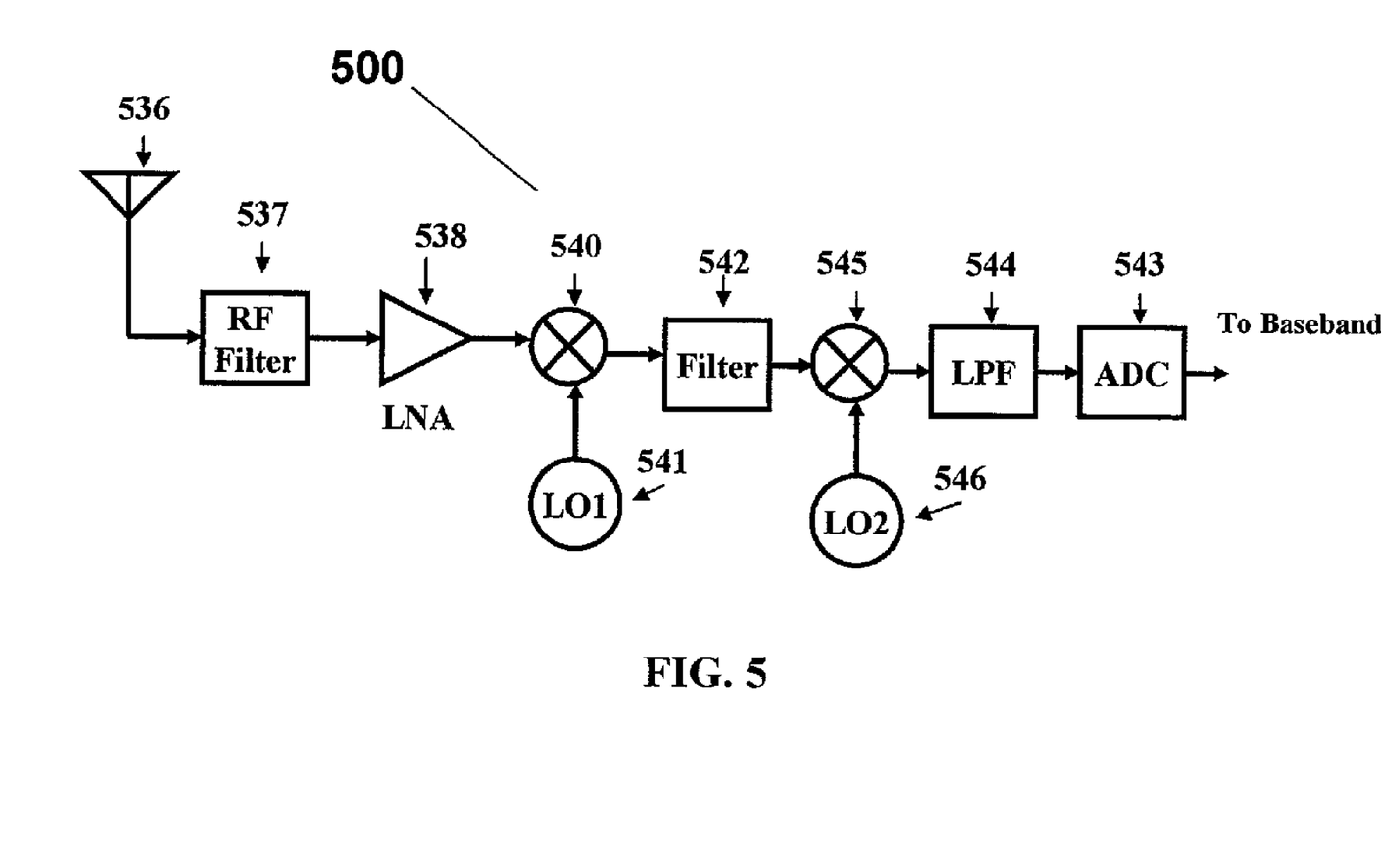
FIG. 5 is a diagram illustrating an example of a low intermediate frequency (IF) receiver.
Figure 6:
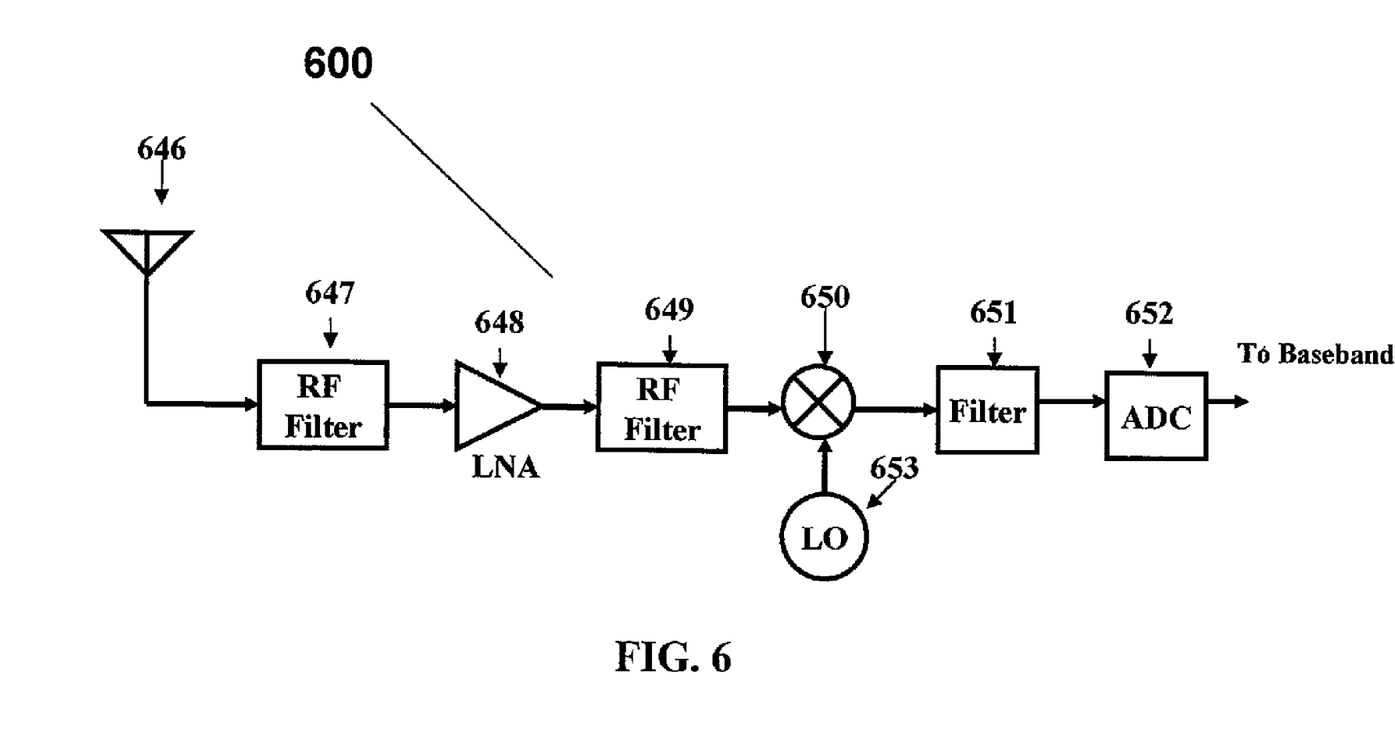
FIG. 6 is a diagram illustrating an example of a direct-conversion receiver.

The disclosed techniques can be used with wireless communication systems. For example, the disclosed techniques can be used with receivers, transmitters, and transceivers, such as the receiver, transmitter, and/or transceiver architectures for superheterodyne receivers, image-rejection (e.g., Hartley, Weaver) receivers, zero-intermediate frequency (IF) receivers, low-IF receivers, direct-up transceivers, two-step up transceivers, and other types of receivers and transceivers for wireless and wireline technologies. FIGS. 5 and 6 are schematics demonstrating two examples of systems in which the timing techniques described above can be used.

In particular, FIG. 5 is a schematic of a low IF receiver 500. A RF signal arriving at an antenna 536 passes through an RF filter 537, a low noise amplifier (LNA) 538, and into a first mixer 540, which translates the RF signal down to an intermediate frequency by mixing it with the signal produced by a first LO 541. The signal then passes through an IF filter into a second mixer 545 to mix with a signal generated by a second LO 546. The output signal from the second mixer then passes through an anti-alias filter 544 before being converted to a digital signal by an ADC 543. In the digital domain, the signal can undergo further filtering and/or mixing before proceeding into the baseband circuits. The ADC 543 can use the CT SD-ADC 100 with the timing illustrated in timing diagram 300.

In another example, FIG. 6 is a schematic of a direct-conversion receiver 600. An antenna 646 couples an RF signal through a first bandpass RF filter 647 into an LNA 648. The signal then proceeds through a second RF filter 649, yielding a band-limited RF signal, which then enters a mixer 650 and mixes with an LO frequency produced by an LO 653. The mixer output is coupled into an anti-aliasing analog filter 651 before being converted to the digital domain by an ADC 652. In the digital domain, the signal can undergo further filtering before proceeding into the baseband circuits. The ADC 652 can use the CT SD-ADC 100 with the timing illustrated in timing diagram 300.

In some implementations, the positions of various components can be moved or exchanged from the disclosed figures with minimal change in circuit functionality. Various topologies for circuit models can be used. The exemplary designs may use various process technologies, such as, for example, CMOS or BiCMOS (Bipolar-CMOS) process technology, or Silicon Germanium (SiGe) technology. In some implementations, switches can be implemented as transmission gate switches. The circuits can be single-ended or fully-differential circuits.

The system can include other components. Some of the components may include computers, processors, clocks, radios, signal generators, counters, test and measurement equipment, function generators, oscilloscopes, phase-locked loops, frequency synthesizers, phones, wireless communication devices, and components for the production and transmission of audio, video, and other data. The number and order of variable gain and filter stages can vary. In addition the number of controllable steps, as well as the steps sizes of each of the stages of gain can also vary.

A number of implementations have been described. Nevertheless, it will be understood that various modifications may be made. Accordingly, other implementations are within the scope of the following claims.

What is claimed is:

1. A method of forming an analog to digital converter comprising:
    coupling an analog input to an input terminal of a cascade of at least one integrator;
    coupling an output of the cascade of at least one integrator to an input of a quantizer, the quantizer being configured to provide a digital output signal on a quantizer output;
    coupling an input of a switched capacitor digital to analog converter to the quantizer output;
    coupling an output of the switched capacitor digital to analog converter to the input terminal of the cascade of at least one integrator; and
    coupling a charge clock output of a clock generator and a discharge clock output of the clock generator to the switched capacitor digital to analog converter, wherein the clock generator is configured to produce a charge clock signal on the charge clock output and a discharge clock signal on the discharge clock output to charge and discharge the switched capacitor analog to digital converter, the charge clock signal and the discharge clock signal having a same clock cycle but different asymmetric duty cycles such that the charge clock signal has a charging signal that is shorter than 50% of the clock cycle and the discharge clock signal has a discharging signal longer than 50% of the clock cycle.

2. The method of claim 1 further comprising coupling the charge clock signal to the quantizer such that the quantizer samples the output of the cascade of at least one integrator during the charging signal of the charge clock signal.

3. The method of claim 1 wherein the switched capacitor digital to analog converter comprises a capacitor, one or more switches, and a reference voltage.

4. The method of claim 1 wherein the quantizer has one or more quantization levels.

5. The method of claim 1 wherein the analog to digital converter is a continuous time sigma-delta analog to digital converter.

6. The method of claim 1 wherein the clock generator is configured to generate the charge clock signal and the discharge clock signal such that the charging signal of the charge clock signal does not overlap the discharging signal of the discharge clock signal.

7. The method of claim 1 wherein the clock cycle of the charge clock signal and the discharge clock signal is a sampling rate of the analog to digital converter.

8. The method of claim 1 wherein the clock generator is configured to generate the charge clock signal and the discharge clock signal based on a system clock.

9. The method of claim 8 wherein the clock generator is configured to generate the charge clock signal and the discharge clock signal such that an available settling time for the at least one integrator is greater than half a clock cycle of the system clock.

10. The method of claim 1 further comprising coupling the quantizer output to a digital filter.

11. A method of operating an analog to digital converter comprising:
    applying an analog input signal to an input terminal of a cascade of at least one integrator to generate an integrated output signal;
    applying the integrated output signal to an input of a quantizer to generate a digital output signal;
    applying the digital output signal to an input of a switched capacitor digital to analog converter to generate an output signal;
    applying the output signal of the switched capacitor digital to analog converter to the input terminal of the cascade of at least one integrator; and
    applying a charge clock signal and a discharge clock signal to the switched capacitor digital to analog converter to charge and discharge the switched capacitor digital to analog converter, the charge clock signal and discharge clock signal having a same clock cycle but different asymmetric duty cycles such that the charge clock signal has a charging signal shorter than 50% of the clock cycle and the discharge clock signal has a discharging signal longer than 50% of the clock cycle.

12. The method of claim 11 further comprising applying the charge clock signal to the quantizer such that the quantizer samples the output of the cascade of at least one integrator during the charging signal of the charge clock signal.

13. The method of claim 11 wherein the switched capacitor digital to analog converter comprises a capacitor, one or more switches, and a reference voltage.

14. The method of claim 11 wherein the quantizer has one or more quantization levels.

15. The method of claim 11 wherein the analog to digital converter is a continuous time sigma-delta analog to digital converter.

16. The method of claim 11 further comprising generating the charge clock signal and the discharge clock signal such that the charging signal of the charge clock signal does not overlap the discharging signal of the discharge clock signal.

17. The method of claim 11 wherein the clock cycle of the charge clock signal and the discharge clock signal is a sampling rate of the analog to digital converter.

18. The method of claim 11 further comprising generating the charge clock signal and the discharge clock signal based on a system clock.

19. The method of claim 18 wherein the available settling time for the at least one integrator is greater than half a clock cycle of the system clock.

20. The method of claim 11 further comprising applying the digital output signal to an input of a digital filter.

21. An analog to digital converter comprising:
a cascade of at least one integrator;
a quantizer having an input coupled to an output of the cascade of at least one integrator and an output to provide a digital output signal;
a switched capacitor digital to analog converter having an input coupled to the output of the quantizer;
a summing junction coupled to an analog input, an output of the switched capacitor digital to analog converter, and the input of the cascade of at least one integrator; and
a clock generator configured to generate a charge clock signal and a discharge clock signal coupled to the switched capacitor digital to analog converter to charge and discharge the switched capacitor digital to analog converter, the charge clock signal and discharge clock signal having a same clock cycle but different asymmetric duty cycles such that the charge clock signal has a charging signal shorter than 50% of the clock cycle and the discharge clock signal has a discharging signal longer than 50% of the clock cycle.

22. The analog to digital converter of claim 21 wherein the charge clock signal is coupled to the quantizer such that the quantizer samples the output of the cascade of at least one integrator during the charging signal of the charge clock signal.

23. The analog to digital converter of claim 21 wherein the switched capacitor digital to analog converter comprises a switched capacitor, one or more switches, and a reference voltage.

24. The analog to digital converter of claim 21 wherein the quantizer has one or more quantization levels.

25. The analog to digital converter of claim 21 wherein the analog to digital converter is a continuous time sigma-delta analog to digital converter.

26. The analog to digital converter of claim 21 wherein the clock generator is configured to generate the charge clock signal and the discharge clock signal such that the charging signal of the charge clock signal does not overlap the discharging signal of the discharge clock signal.

27. The analog to digital converter of claim 21 wherein the clock cycle of the charge and the discharge clock signals is a sampling rate of the analog to digital converter.

28. The analog to digital converter of claim 21 wherein the clock generator is configured to generate the charge clock signal and the discharge clock signal based on a system clock.

29. The analog to digital converter of claim 28 wherein the clock generator is configured to generate the charge clock signal and the discharge clock signal such that an available settling time for the at least one integrator is greater than half a clock cycle of the system clock.

30. The analog to digital converter of claim 21 wherein the digital output signal is coupled to a digital filter.

31. A receiver comprising:
an antenna to receive a radio frequency input signal;
a radio frequency filter coupled to the antenna to receive the radio frequency input signal from the antenna;
a low noise amplifier having an input coupled to an output of the radio frequency filter;
a first mixer coupled to an output of the low noise amplifier and configured to perform image rejection and mix an output signal of the low noise amplifier with a first local oscillator signal;
an intermediate frequency filter coupled to an output of the first mixer;
a second mixer coupled to an output of the intermediate frequency filter and configured to mix an output signal of the intermediate frequency filter with a second local oscillator signal;
a low-pass filter having an input coupled to an output of the second mixer;
a digital to analog converter having an input coupled to an output of the low-pass filter, the digital to analog converter comprising:
a cascade of at least one integrator;
a quantizer having an input coupled to an output of the cascade of at least one integrator and an output to provide a digital output signal;
a switched capacitor digital to analog converter having an input coupled to the output of the quantizer;
a summing junction coupled to the input of the analog to digital converter, an output of the switched capacitor digital to analog converter, and the input of the at least one integrator; and
a clock generator configured to generate a charge clock signal and a discharge clock signal coupled to the switched capacitor digital to analog converter, the charge clock signal and the discharge clock signal having a same clock cycle but different asymmetric duty cycles such that the charge clock signal has a charging signal shorter than 50% of the clock cycle and the discharge clock signal has a discharging signal longer than 50% of the clock cycle; and
a baseband processing device having an input coupled to the output of the quantizer to digitally filter the digital output signal.

32. The receiver of claim 31 wherein the charge clock signal is coupled to the quantizer such that the quantizer samples the output of the cascade of at least one integrator during the charging signal of the charge clock signal.

* * * * *